United States Patent [19]

Hayase

[11] Patent Number: 5,447,596
[45] Date of Patent: Sep. 5, 1995

[54] APPARATUS FOR PRODUCING SEMICONDUCTOR WAFERS

[75] Inventor: Iwao Hayase, Itami, Japan

[73] Assignee: Mitsubishi Denki Kabushiki Kaisha, Tokyo, Japan

[21] Appl. No.: 207,419

[22] Filed: Mar. 8, 1994

[30] Foreign Application Priority Data

Mar. 10, 1993 [JP] Japan .................................. 5-048866

[51] Int. Cl.6 ........................................... B32B 35/00
[52] U.S. Cl. ................................. 156/584; 156/344; 269/21; 279/3
[58] Field of Search .................. 156/344, 584; 269/21; 279/3

[56] References Cited

U.S. PATENT DOCUMENTS

| | | | |
|---|---|---|---|
| 2,520,977 | 9/1950 | Suben | 279/3 |
| 4,021,278 | 5/1977 | Hood et al. | 269/21 X |
| 4,093,378 | 6/1978 | Horr et al. | 269/21 X |
| 4,752,180 | 6/1988 | Yoshikawa | 414/737 |
| 4,856,766 | 8/1989 | Huberts | 269/21 |
| 5,087,315 | 2/1992 | King et al. | 156/584 X |
| 5,092,954 | 3/1992 | Braun et al. | 156/584 X |
| 5,131,968 | 7/1992 | Wells et al. | 156/153 |
| 5,133,824 | 7/1992 | Huberts et al. | 156/584 X |
| 5,273,615 | 12/1993 | Asetta et al. | 156/344 X |
| 5,316,276 | 5/1994 | Heinle | 269/21 |

FOREIGN PATENT DOCUMENTS

| | | | |
|---|---|---|---|
| 245085 | 4/1987 | Germany | 269/21 |
| 52-49281 | 4/1977 | Japan | 156/344 |
| 62-280377 | 12/1987 | Japan | 156/344 |
| 2219135 | 5/1989 | United Kingdom | |
| 2219135 | 11/1989 | United Kingdom | 156/584 |

OTHER PUBLICATIONS

Anonymous, "Rework of Chips on Flexible Circuit Boards", Research Disclosure, Sep. 20, 1990, Emsworth, GB p. 831.

Primary Examiner—Mark A. Osele
Attorney, Agent, or Firm—Leydig, Voit & Mayer

[57] ABSTRACT

An apparatus for separating a wafer from a support plate, to which the wafer is bonded with a thermally softened adhesive, includes an upper plate having opposite upper and lower surfaces and a plurality of holes having apertures at the lower surface through which air is evacuated to hold the support plate to the lower surface; a lower plate having opposite upper and lower surfaces and a plurality of holes having apertures at the upper surface through which air is evacuated to hold the wafer to the upper surface; a heater for softening the thermally softened adhesive embedded in at least one of the upper and lower plates; a robot arm for moving the upper plate in vertical and horizontal directions; and a shaft for rotatably connecting the upper plate to the robot arm. In operation, after the adhesive connecting the wafer and the support plate is softened by the heater, the robot arm moves the upper plate upward while rotating or turning the upper plate, whereby the support plate is separated from the wafer. Therefore, the wafer is prevented from cracking and breaking, whereby the production yield is increased, resulting in a reduction in the cost of the device.

19 Claims, 19 Drawing Sheets

APPARATUS FOR PRODUCING SEMICONDUCTOR WAFERS

FIELD OF THE INVENTION

The present invention relates to an apparatus for producing semiconductor wafers and, more particularly, to an apparatus for separating a wafer from a support plate which is adhered to the wafer with a thermally softened adhesive to increase the strength of the wafer during rear surface treatment of the wafer.

BACKGROUND OF THE INVENTION

FIG. 19 is a sectional view illustrating a conventional apparatus for separating a wafer from a support substrate. FIG. 20 is a sectional view of a wafer adhered to a support plate.

In FIG. 20, a wafer 1 is adhered to a support plate 2, such as a glass plate, with a thermally softened adhesive 209, such as wax. Hereinafter, the wafer 1 with the glass plate 2 is called a work 20. Reference numeral 3 designates a metal projection formed at the periphery of the boundary between the wafer 1 and the glass plate 2 due to vapor-deposition or plating.

In FIG. 19, the work 20 is interposed between a lower plate 201 and an upper plate 204. A lower plate 201 includes an upper surface 201a in contact with the wafer 1 of the work 20 and a plurality of openings 201b at the upper surface 201a. These openings 201b are connected to a tube 202, and the tube 202 is connected to an external vacuum pump (not shown). Since air is evacuated through the openings 201b by the vacuum pump, the wafer 1 is held against the upper surface 201a of the lower plate 201. A heater 203 is buried in the lower plate 201.

The structure of the upper plate 204 is identical to the lower plate 201. That is, the upper plate 204 includes a lower surface 204a in contact with the glass plate 2 of the work 20 and a plurality of openings 204b at the lower surface 204a. These openings 204b are connected to a tube 205, and the tube 205 is connected to an external vacuum pump (not shown). Since air is evacuated through the openings 204b by the vacuum pump, the glass plate 2 is held against the lower surface 204a of the upper plate 204. A heater 206 is buried in the upper plate 204. Furthermore, an end of a shaft 207 is fixed to the upper surface of the upper plate 204, and the other end is fixed to a handle 208.

A description is given of the operation.

Initially, a wafer 1 (diameter: 76 mm, thickness: 600 μm) having a front surface on which circuit elements are disposed is adhered to a glass plate 2 using wax 209 so that the front surface of the wafer 1 is in contact with the glass plate 2, whereby the wafer 1 is reinforced. Then, the wafer 1 is ground from the rear surface until the thickness of the wafer is several microns to several hundreds of microns. Thereafter, a metal pattern is formed on the rear surface of the wafer 1 by plating or the like. In the plating process, a metal projection 3 is grown at the periphery of the contact part between the wafer 1 and the glass plate 2 as shown in FIG. 20.

After the process on the rear surface of the wafer 1, an operator puts the work 20 on the upper surface 201a of the lower plate 201 by hand. Since air is evacuated through the openings 201b of the lower plate 201 by the vacuum pump, the wafer 1 is fixed to the surface 201a. At the same time, the lower plate 201 is heated by the heater 203.

Then, the operator takes the handle 208 of the upper plate 204 and puts the upper plate 204 on the glass plate 2 of the work 20. Since air is evacuated through the openings 204b of the upper plate 204, the support plate 2 is held against the lower surface 204a of the upper plate 204. The upper plate 204 is heated by the heater 206.

The work 20 is heated for a prescribed time to soften the wax 209 between the wafer 1 and the glass plate 2 and, thereafter, the handle 208 is moved in the direction indicated by the arrow in FIG. 19, whereby the glass plate 2 is separated from the wafer 1. Then, the operator manually disconnect the wafer 1 and the glass plate 2 from the lower plate 201 and the upper plate 204, respectively, followed by subsequent process steps.

In the above-described conventional apparatus, when the glass plate 2 is separated from the wafer 1, the wafer 1 is flawed or cracked due to the metal projection 3, whereby the wafer is broken in the wafer separating step or in the subsequent steps, such as a wafer washing step.

SUMMARY OF THE INVENTION

It is an object of the present invention to provide an apparatus for separating a wafer from a support plate that prevents the wafer from cracking or breaking when it is separated from the support plate, thereby increasing production yield and reducing the cost of the device.

It is another object of the present invention to automate such an apparatus.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, an apparatus for separating a wafer from a support plate, the wafter being bonded to the support plate by a thermally softened adhesive, comprises an upper plate having opposite upper and lower surfaces and a plurality of holes having apertures at the lower surface through which air is evacuated to hold support plate to the lower surface; a lower plate having opposite upper and lower surfaces and a plurality of holes having apertures at the upper surface through which air is evacuated to hold the wafer to the upper surface; a heater for softening the thermally softened adhesive, embedded in at least one of the upper and lower plates; a robot arm for moving the upper plate in vertical and horizontal directions; and a shaft for rotatably connecting the upper plate to the robot arm. In operation, after the thermally softened adhesive connecting the wafer and the support plate is softened by the heater, the robot arm moves the upper plate upward while rotating or turning the upper plate, whereby the support plate is separated from the wafer. Therefore, the wafer is prevented from cracking and breaking, whereby the production yield is increased, resulting in a reduction in the cost of the device. In addition, since the upper plate is supported and controlled by the robot arm, the separation is easily carried out with high reliability.

According to a second aspect of the present invention, the apparatus further includes means for absorbing shock generated when the work, i.e., the wafer with the support plate, held against the lower surface of the upper plate is put on the upper surface of the lower plate. Therefore, the wafer is prevented from cracking.

According to a third aspect of the present invention, the apparatus further includes means for holding the support plate to the lower surface of the upper plate by pressing the support plate against the lower surface. Therefore, when the upper plate is moved upward by the robot arm, the peripheral portion of the support plate is bent upward, and the support plate is gradually separated from the periphery of the wafer, whereby the separation is facilitated.

According to a fourth aspect of the present invention, the apparatus further includes means for pulling the lower plate downward in the vertical direction, disposed on the lower surface of the lower plate. The tensile force applied to the lower plate is a little lower than the attraction of the upper and lower plates. Therefore, the separation is carried out with high stability.

According to a fifth aspect of the present invention, the upper plate has a convex lower surface. Therefore, the support plate is easily separated from the wafer.

According to a sixth aspect of the present invention, the upper plate comprises a central disc part fixed to the shaft and a peripheral annular part moving in the vertical direction. The peripheral annular part is moved upward prior to the central disc part, so that the support plate is separated from the periphery of the wafer.

According to a seventh aspect of the present invention, the apparatus further includes a nozzle for applying a solution that dissolves the thermally softened adhesive at the boundary between the wafer and the support plate. Therefore, the removal of the adhesive is encouraged, whereby the separation is facilitated.

According to an eighth aspect of the present invention, the apparatus is put in a container filled with a solution that dissolves the thermally softened adhesive. Further, the container is hermetically sealed and the pressure in the container is increased. Therefore, the permeation of the solution into the adhesive is increased.

DETAILED DESCRIPTION OF THE PREFERRED EMBODIMENTS

Figure 1:
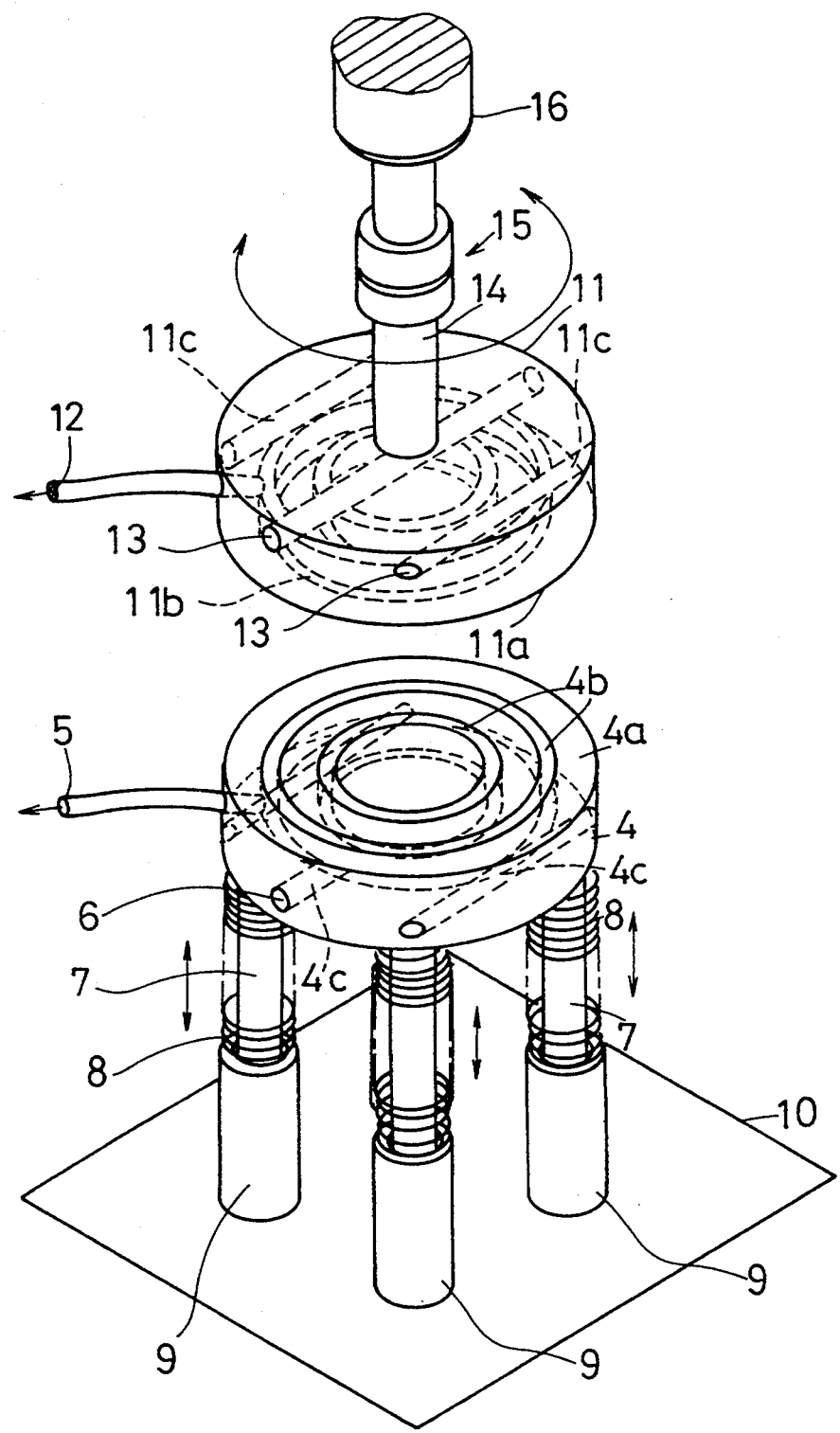
FIG. 1 is a perspective view illustrating an apparatus for separating a wafer from a support plate in accordance with a first embodiment of the present invention.
Figure 2:
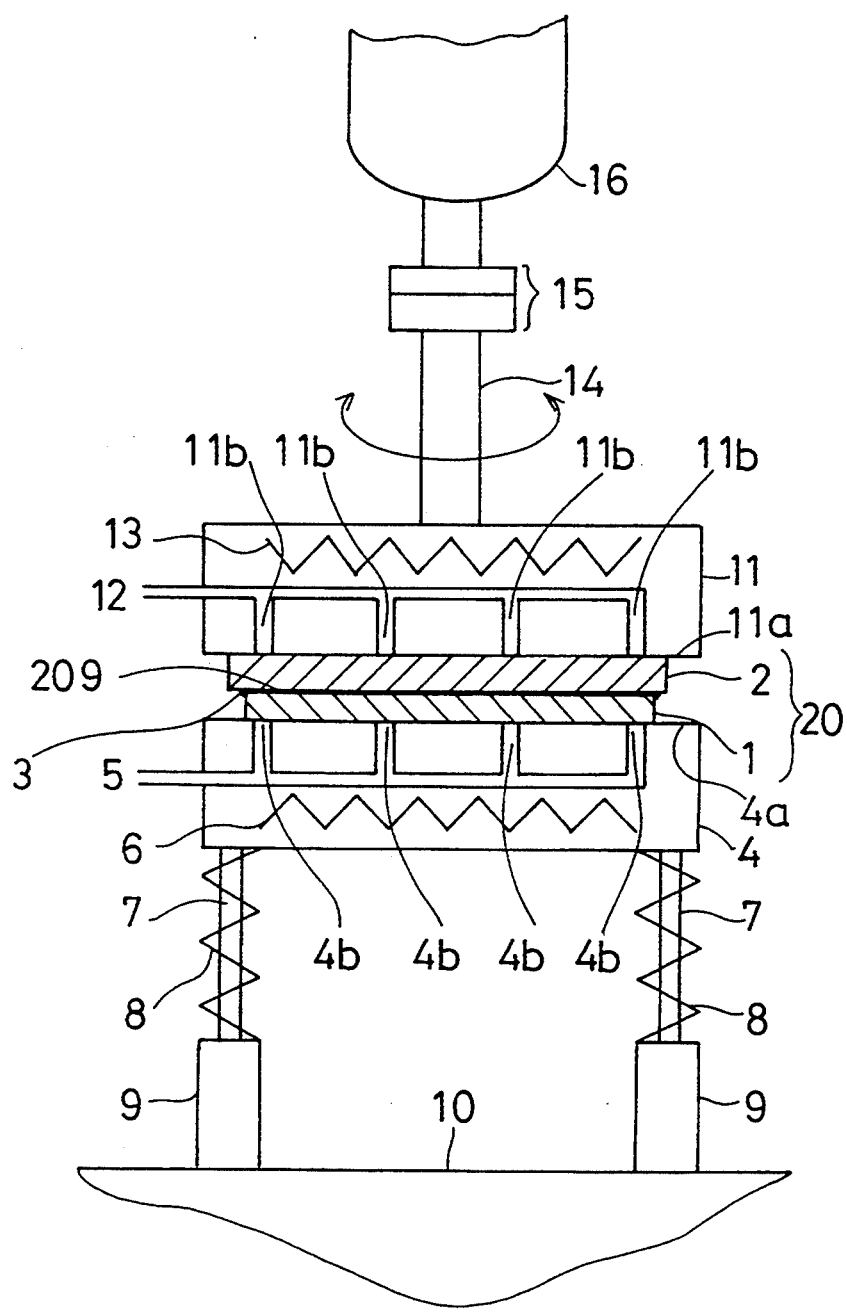
FIG. 2 is a sectional view of the apparatus shown in FIG. 1.
Figure 3:
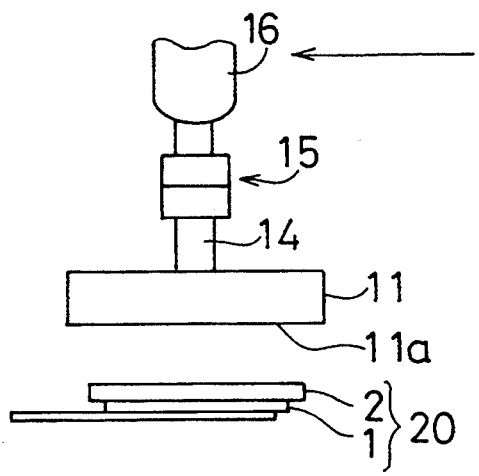
FIGS. 3(a) to 3(c) are sectional views for explaining the operation of the apparatus shown in FIG. 1.
Figure 3:
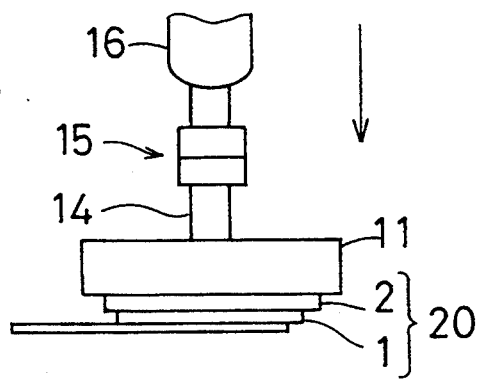
Figure 3:
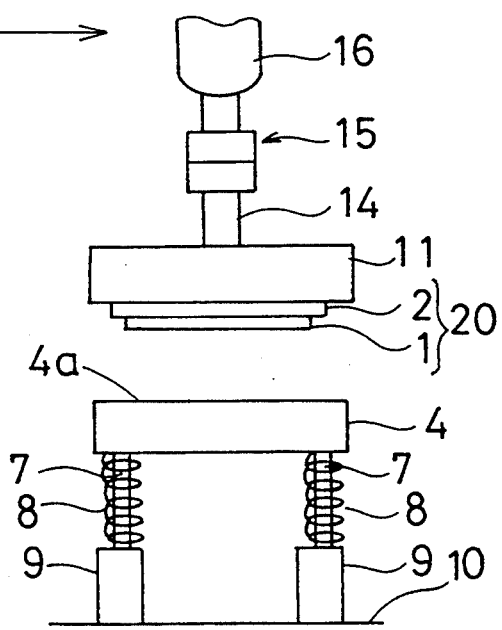

FIGS. 1 and 2 are a perspective view and a sectional view, respectively, illustrating an apparatus for separating a wafer from a support plate in accordance with a first embodiment of the present invention. FIGS. 3(a)–3(c) are sectional views for explaining the operation of the apparatus shown in FIGS. 1 and 2. In this first embodiment, a lower disc plate 4 includes an upper surface 4a in contact with the wafer 1 of the work 20, at least two concentric annular grooves 4b connected to each other in the lower plate 4, and a tube 5 connecting the annular grooves 4b to an external vacuum pump (not shown). Air is evacuated through the annular grooves 4b and the tube 5 by the vacuum pump, so that the wafer 1 is held against the upper surface 4a of the lower plate 4. The lower plate 4 further includes a plurality of through holes 4c in which cartridge heaters 6 are inserted.

Four guide rods 7 are fixed to the lower surface of the lower plate 4 at equal intervals in a direction perpendicular to the lower surface. These rods 7 are inserted in cylindrical and hollow holders 9 which are fixed to a base 10. Four springs 8 are disposed between the lower plate 4 and the respective holders 9. The lower plate 4 is supported by the elasticity of the springs 8, whereby any mechanical shock applied to the lower plate 4 when the work is mounted on the upper surface 4a is reduced.

An upper plate 11 has the same structure as the above-described lower plate 4. That is, the upper plate 11 includes a lower surface 11a in contact with the glass plate 2 of the work 20, at least two concentric annular grooves 11b connected to each other in the upper plate 11, and a tube 12 connecting the annular grooves 11b to an external vacuum pump (not shown). Air is evacuated through the annular grooves 11b and the tube 12 by the vacuum pump, so that the work 20 is held against the lower surface 11a of the upper plate 11. The upper plate 11 further includes a plurality of through-holes 11c in which cartridge heaters 13 are inserted. An end of a shaft 14 is fixed to the center of the upper surface of the upper plate 11 while the other end is connected to a robot arm 16 via a coupling 15, so that the upper plate 11 can be vertically and rotatably moved by the robot arm 16.

A description is given of the operation.

When a work 20 comprising a wafer 1 and a glass plate 2 is taken out from a cassette (not shown), the upper plate 11 is moved to a position above the work 20 by the robot arm 16 (FIG. 3(a)). Then, the robot arm 16 is moved downward until the lower surface 11a of the upper plate 11 is in contact with the glass plate 2 of the work 20, and air is evacuated through the grooves 11b of the upper plate 11, whereby the work 20 is held against the lower surface 11a (FIG. 3(b)). Then, the upper plate 11 holding the work 20 is moved to a position above the upper surface 4a of the lower plate 4 by the robot arm 16 (FIG. 3(c)). Then, the robot arm 16 is moved downward until the wafer 1 is in contact with the upper surface 4a of the lower plate 4, and air is evacuated through the grooves 4b of the lower plate 4, whereby the work 20 is held against the upper surface 4a of the lower plate 4. Shock applied to the lower plate 4 when the work 20 is mounted on the upper surface 4a is reduced by the elasticity of the springs 8. Thereafter, the work 20 is heated by the cartridge heaters 6 and 13 embedded in the lower and upper plates 4 and 11, respectively, to soften the wax 209 between the wafer 1 and the glass plate 2. Thereafter, the robot arm 16 is moved upward while rotating or turning the upper plate 11, whereby the glass plate 2 is separated from the wafer 1.

According to the first embodiment of the present invention, after the wax 209 is softened by the heaters 6 and 13, the robot arm 16 moves the upper plate 11 upward while rotating or turning the upper plate 11, whereby the glass plate 2 is favorably separated from the wafer 1 with no flaw and no cracking of the wafer. Therefore, breakage of the wafer due to a flaw or cracking is avoided, so that the production yield is increased, resulting in a reduction in the cost of the device.

Further, since the upper plate 11 is supported and controlled by the robot arm 16, the rotation and the upward move of the upper plate 11 to separate the glass plate 2 from the wafer 1 is easily carried out, whereby automation of the apparatus is easily realized.

Further, since shock generated by the upper plate 11 when the work 20 is mounted on the lower plate 4 is absorbed by the elasticity of the springs 8, the wafer 1 is prevented from cracking.

While in the above-described first embodiment the upper plate 11 is rotated or turned to facilitate separation between the wafer 1 and the glass plate 2, the rotation and the turning may be combined.

While in the above-described first embodiment the robot arm 16 is moved upward while rotating or turning the upper plate 11, it may be moved upward after weakening of the bonding strength between the wafer 1 and the glass plate 2 by rotating or turning the upper plate 11.

Figure 4:
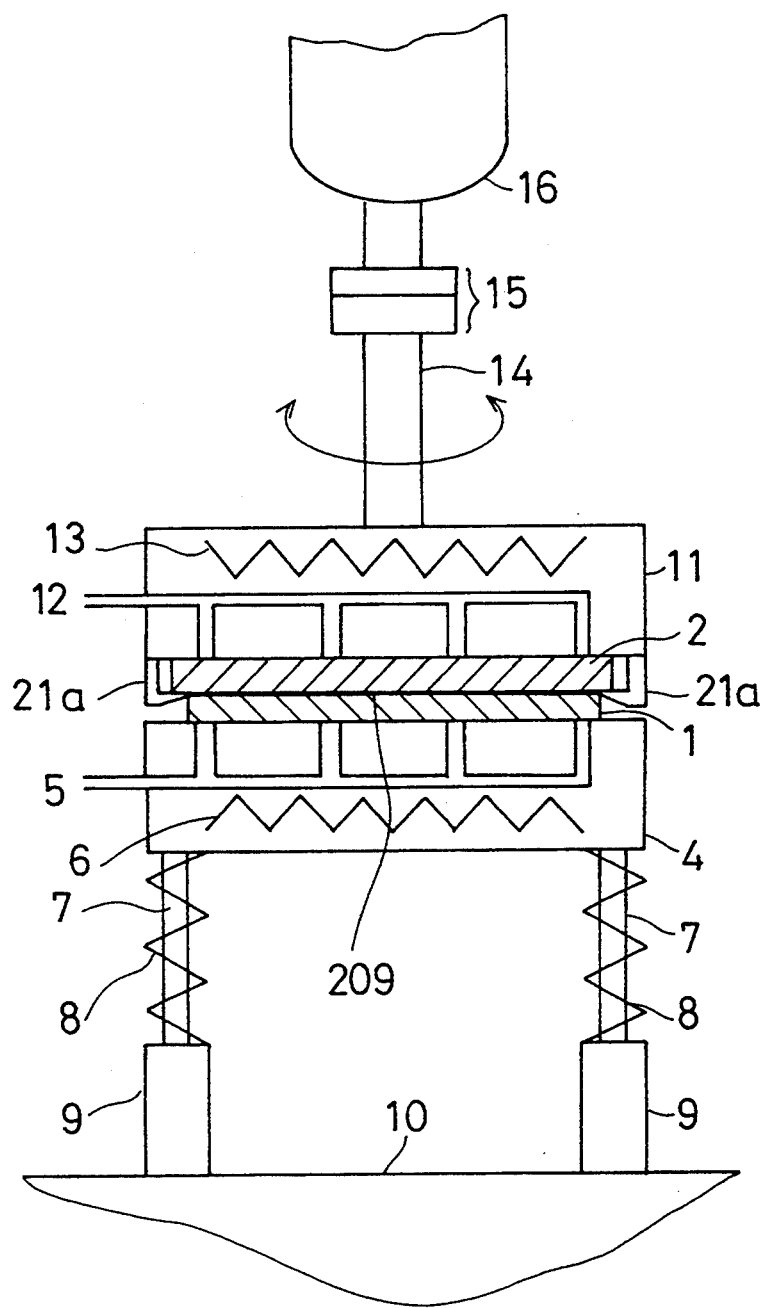
FIG. 4 is a sectional view illustrating an apparatus for separating a wafer from a support plate in accordance with a second embodiment of the present invention.
Figure 5:
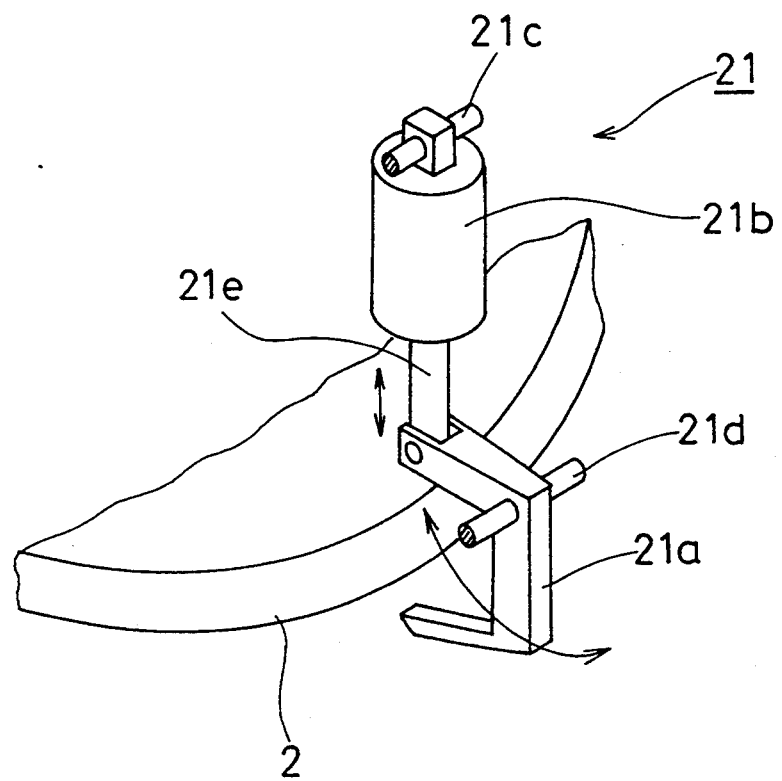
FIG. 5 is a perspective view illustrating a mechanism for holding a wafer included in the apparatus shown in FIG. 4.
Figure 6:
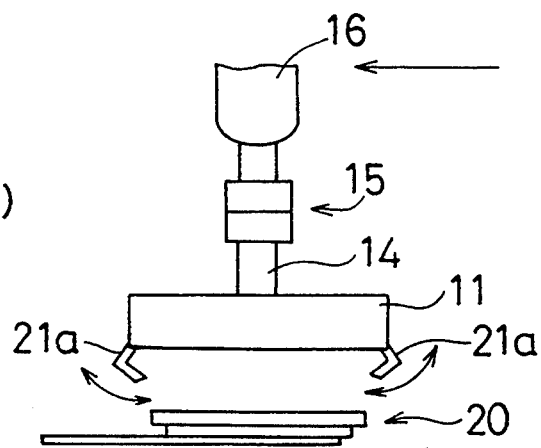
FIGS. 6(a) and 6(b) are sectional views for explaining the operation of the wafer holding mechanism of FIG. 5.
Figure 6:
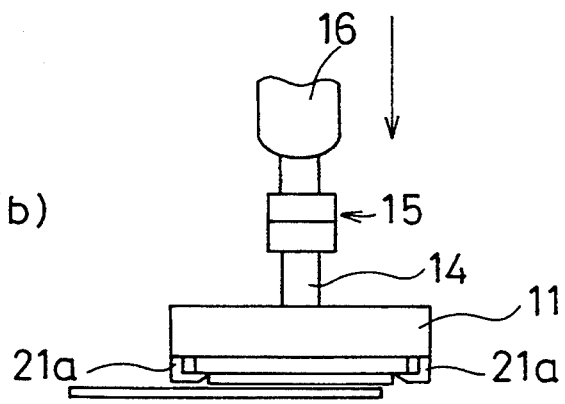

FIG. 4 is a sectional view illustrating an apparatus for separating a wafer from a support plate in accordance with a second embodiment of the present invention. FIG. 5 is a perspective view illustrating a glass plate holding mechanism included in the apparatus of FIG. 4. FIGS. 6(a) and 6(b) are sectional views for explaining the operation of the mechanism.

As shown in FIG. 4, the upper plate 11 includes a pair of glass plate holding members 21 for holding the glass plate 2 at two locations on the periphery of the glass plate. As shown in FIG. 5, each glass plate holding member 21 comprises a claw 21a for pressing the glass plate 2 to the lower surface 11a of the upper plate 11, and an air cylinder 21b having a cylinder pin 21e pivotally connected operating point of the claw 21a. The air cylinder 21b and the claw 21a are pivotally fixed to the upper plate 11 by a first axle 21d and a second axle 21d, respectively.

A description is given of the operation.

When the work 20 is not held against the surface 11a of the upper plate 11, the cylinder pin 21e protrudes from the air cylinder 21b, and the claw 21a that is pivotally connected to the cylinder pin 21e is turned outward on the second axle 21d (FIG. 6(a)). When the work 20 is held against the surface 11a of the upper plate 11, the air cylinder 21b operates so that the claw 21a is pulled by the cylinder pin 21a, whereby the claw 21a is turned toward the work 20 on the second axis 21d (FIG. 6(b)). In this way, the glass plate 2 of the work 20 is pressed against the lower surface 11a of the upper plate 11 by the claws 21a. Thereafter, as in the first embodiment, the work 20 is mounted on the lower plate 4. After heating of the work 20 to soften the wax 209, the upper plate 11 is moved upward to separate the glass plate 2 from the wafer 1. Since the claws 21a hold the glass plate 2 at the edge, the edge of the glass plate 2 is bent when the upper plate 11 moves upward, and the glass plate 2 is slowly peeled from the periphery of the wafer 1, whereby the separation is facilitated.

Figure 7:
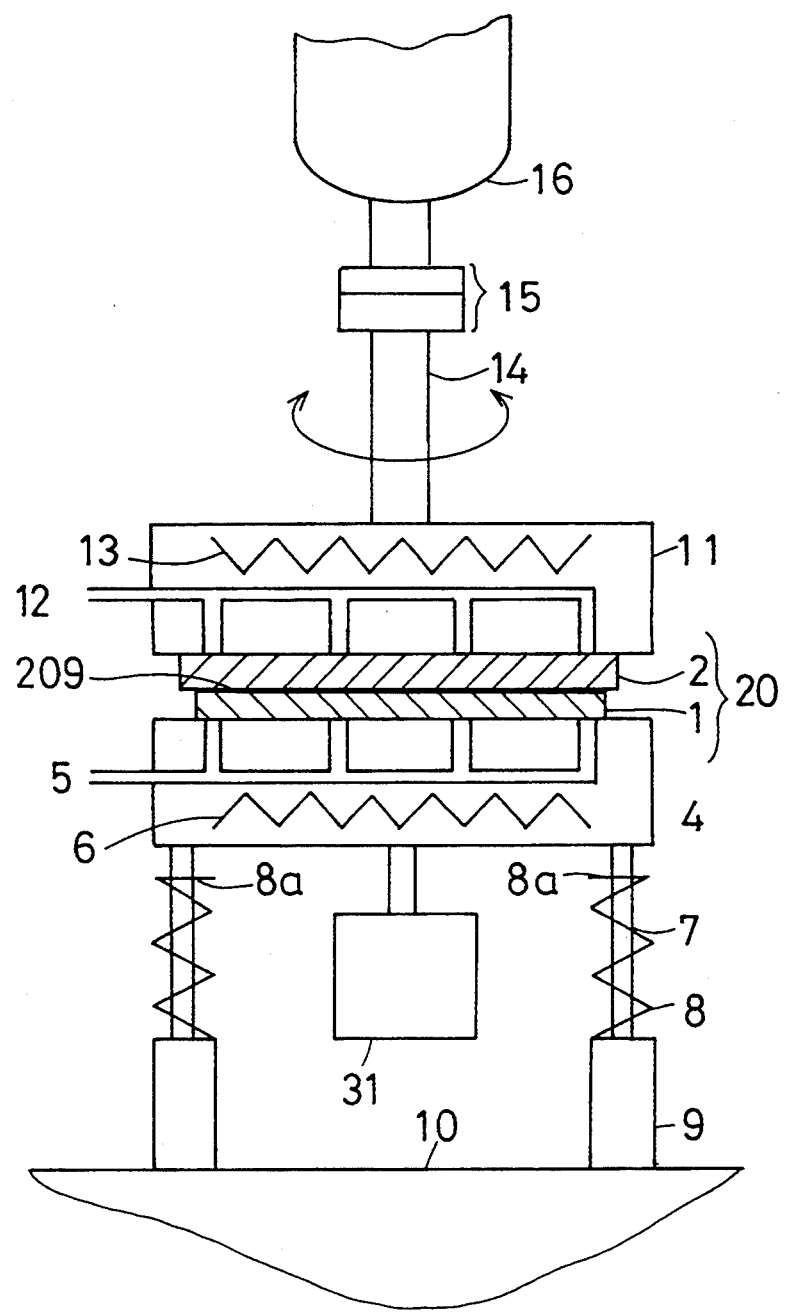
FIG. 7 is a sectional view illustrating an apparatus for separating a wafer from a support plate in accordance with a third embodiment of the present invention.

FIG. 7 is a sectional view illustrating an apparatus for separating a wafer from a support plate in accordance with a third embodiment of the present invention. In this third embodiment, a weight 31 is connected to the lower surface of the lower plate 4 to pull the lower plate 4 downward in the vertical direction. The weight 31 must be heavy enough to maintain the attraction between the upper plate 11 and the glass plate 2 and the attraction between the lower plate 4 and the wafer 1 when the robot arm 16 pulls up the upper plate 11. The lower end of the spring 8 is fixed to the cylindrical holder 9. Since the upper end 8a of the spring 8 is not fixed to the lower plate 4, when the upper and lower plates 11 and 4 are pulled up, the upper end 8a of the spring 8 separates from the lower plate 4. That is, the tension of the spring 8 is not applied to the lower plate 4.

As described above, in this third embodiment, the rising speed of the robot arm 16 is suppressed by the weight 31 fixed to the lower surface of the lower plate 4. Therefore, even if a robot arm moving at a rate of 0.1 mm/sec. is employed, a precisely-controlled upward movement of the robot arm 16 is possible, whereby the separation between the glass plate 2 and the wafer 1 is carried out smoothly even if the wax 209 is not softened enough.

Figure 8:
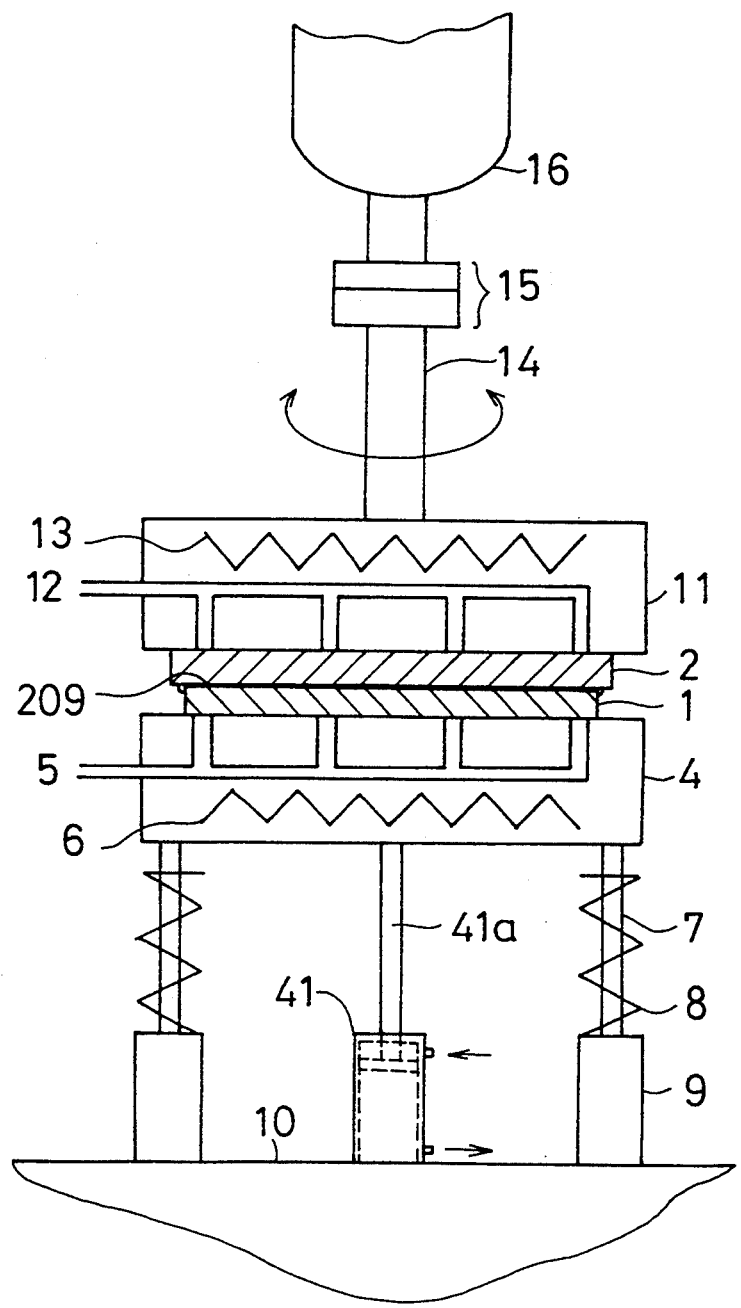
FIG. 8 is a sectional view illustrating an apparatus for separating a wafer from a support plate in accordance with a fourth embodiment of the present invention.

FIG. 8 is a sectional view illustrating an apparatus for separating a wafer from a support plate in accordance with a fourth embodiment of the present invention. In this fourth embodiment, an air cylinder 41 is employed in place of the weight 31 of the third embodiment. The air cylinder 41 is disposed on the base 10, and the cylinder pin 41a is fixed to the lower surface of the lower plate 4.

In this structure, since the lower plate 4 is pulled downward by the air cylinder 41, it is possible to move the lower plate 4 downward according to the upward movement of the robot arm 16, whereby the separation between the wafer 1 and the glass plate 2 is carried out with higher stability compared to the third embodiment.

Figure 9:
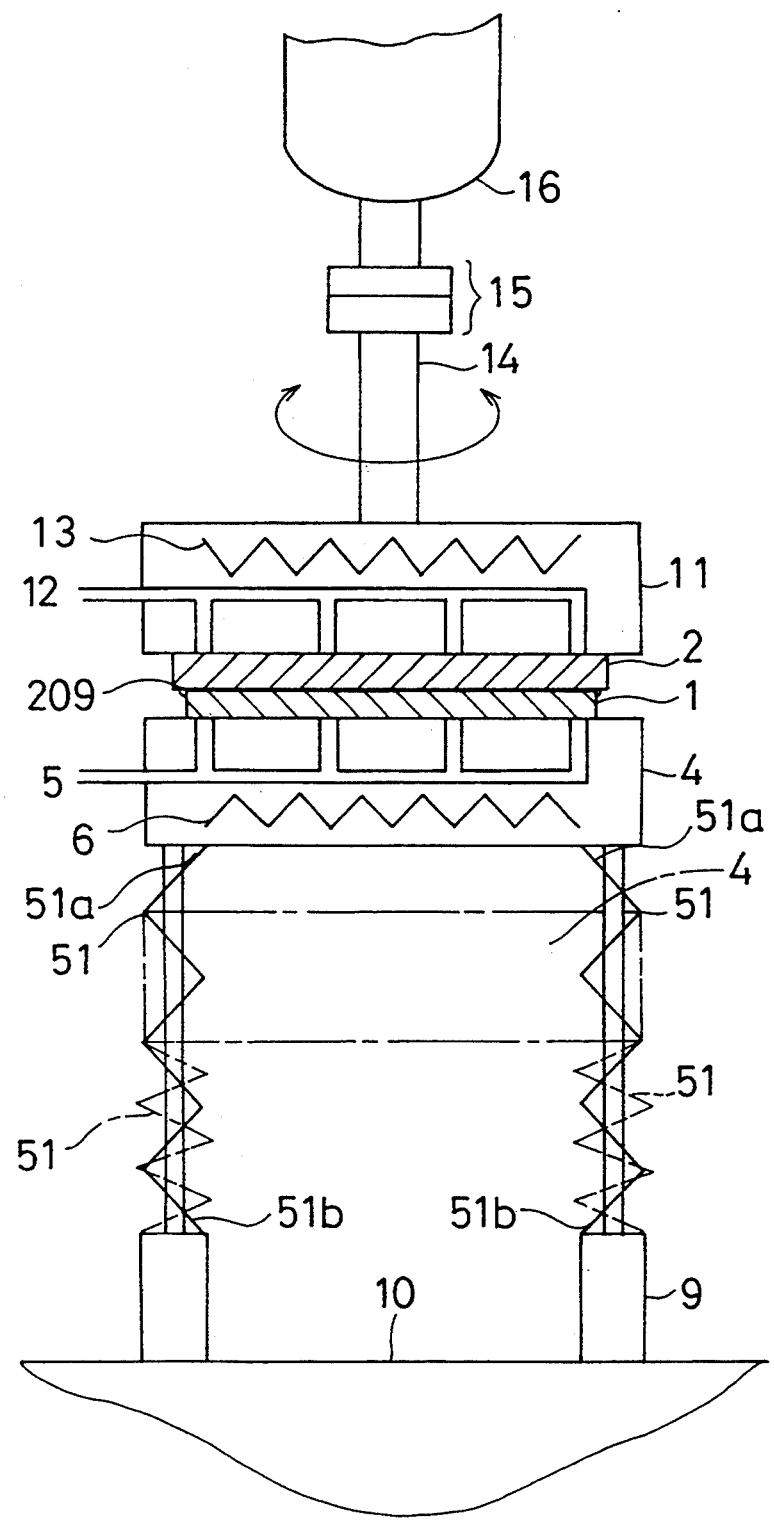
FIG. 9 is a sectional view illustrating an apparatus for separating a wafer from a support plate in accordance with a fifth embodiment of the present invention.

FIG. 9 is a sectional view illustrating an apparatus for separating a wafer from a support plate in accordance with a fifth embodiment of the present invention. In this fifth embodiment, an upper end 51a of the spring 51 is fixed to the rear surface of the lower plate 4 and a lower end 51b of the spring 51 is fixed to the cylindrical holder 9, whereby the resiliency of the spring 51 is used as the lower plate pulling means, in place of the weight 31 of the third embodiment.

In this structure, when the upper and lower plates 11 and 4 are moved upward by the robot arm 16, the resiliency of the spring 51 acts on the lower plate 4 as a tensile force, whereby the separation between the glass plate 2 and the wafer 1 is carried out with high stability.

Figure 10:
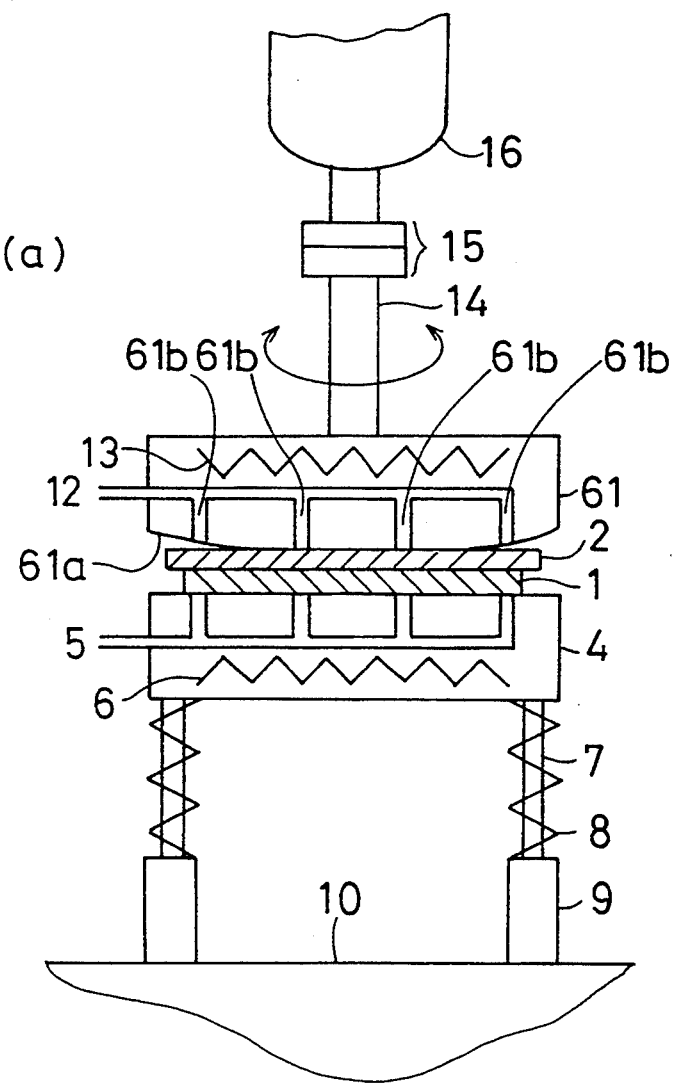
FIGS. 10(a) and 10(b) are sectional views illustrating an apparatus for separating a wafer from a support plate in accordance with a sixth embodiment of the present invention.
Figure 10:
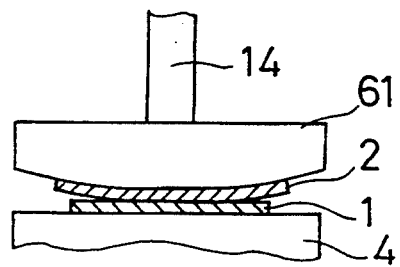

FIG. 10(a) is a sectional view illustrating an apparatus for separating a wafer from a support plate in accordance with a sixth embodiment of the present invention, and FIG. 10(b) is a sectional illustrating a part of the apparatus shown in FIG. 10. In this sixth embodiment, an upper plate 61 has a convex surface 61a against which the glass plate 2 is held. The curvature of the convex surface 61a is in a range from several tens of microns to several hundreds of microns.

In this structure, after the work 20 is mounted on the lower plate 4 (FIG. 10(a)), the peripheral portion of the glass plate 2 is held against the convex surface 61a of the upper plate 61 (FIG. 10(b)). Therefore, when the upper plate 61 is moved upward by the robot arm 16, the glass plate 2 is gradually peeled from the periphery of the wafer 1, realizing a stable separation.

Figure 11:
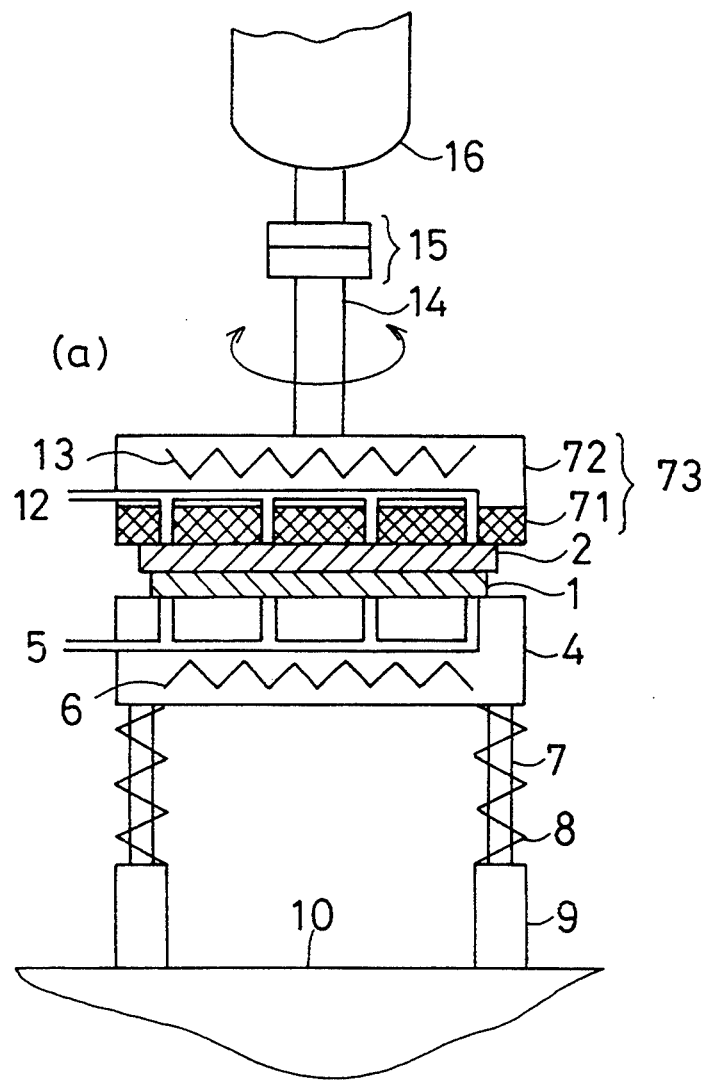
FIGS. 11(a) and 11(b) are sectional views illustrating an apparatus for separating a wafer from a support plate in accordance with a seventh embodiment of the present invention.
Figure 11:
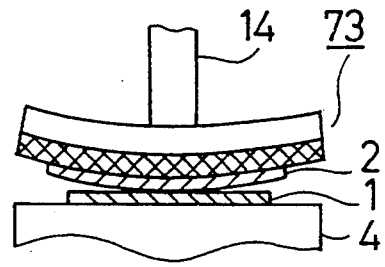

FIG. 11(a) is a sectional view illustrating an apparatus for separating a wafer from a support plate in accordance with a seventh embodiment of the present invention, and FIG. 11(b) is a sectional view illustrating a part of the apparatus in the vicinity of an upper plate. In this seventh embodiment, an upper plate 73 comprises a lower layer 71 comprising a material having a relatively large thermal expansion coefficient, such as brass, and an upper layer 72 comprising a material having a relatively small thermal expansion coefficient, such as invar.

In this structure, when the upper plate 73 is heated by the cartridge heater 13 to soften the wax 209, the upper plate 73 curves outwards due to a difference in thermal expansion coefficients between the upper and lower layers 72 and 71, providing a convex surface on the lower layer 71 against which the glass plate 2 is held. The curvature of the convex surface is in a range from several tens of microns to several hundreds of microns. Also in this case, the same effects as described in the sixth embodiment are achieved.

While in the above-described seventh embodiment the upper plate 73 comprises upper and lower layers 72 and 71 having different thermal expansion coefficients, the upper plate 73 or the lower layer 71 may comprise shape memory alloys which curve convexly when heat is applied.

Figure 12:
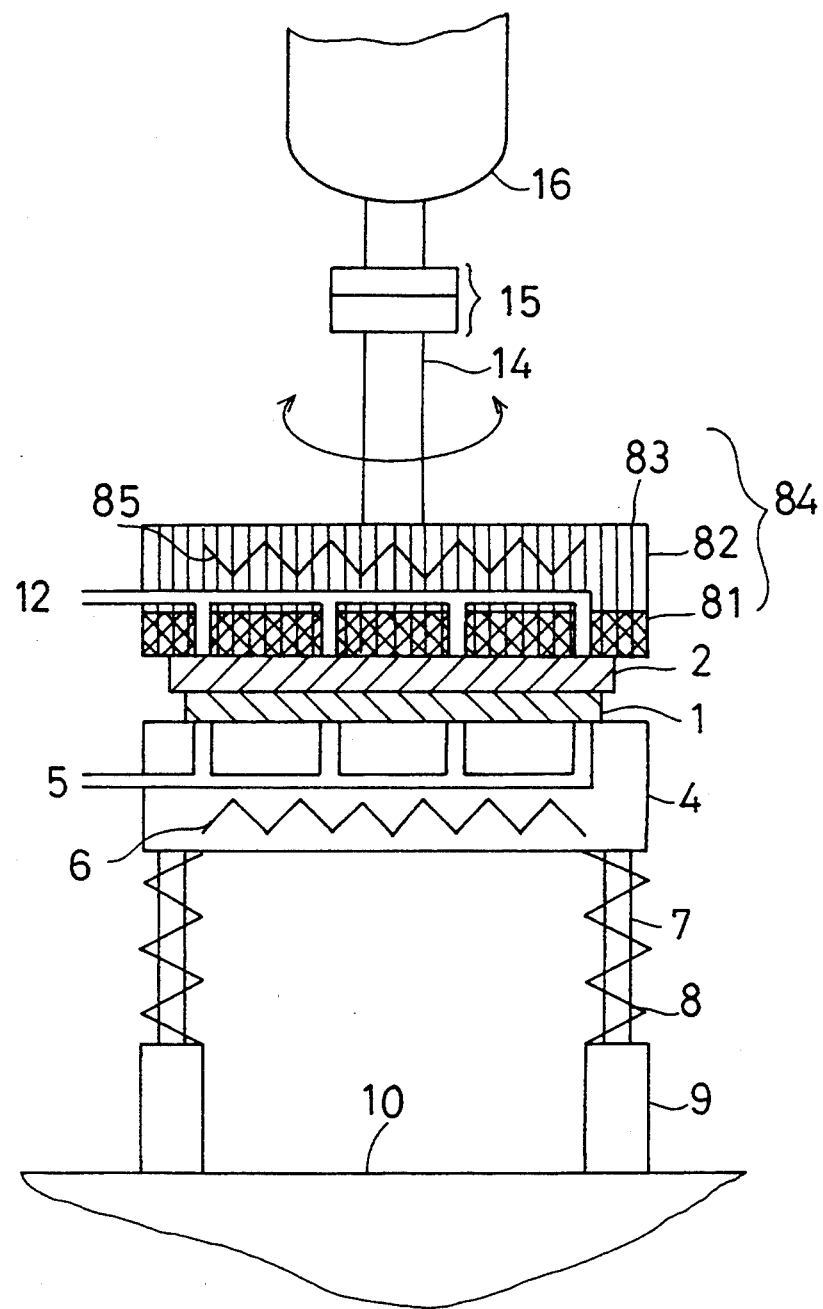
FIG. 12 is a sectional view illustrating an apparatus for separating a wafer from a support plate in accordance with an eighth embodiment of the present invention.
Figure 13:
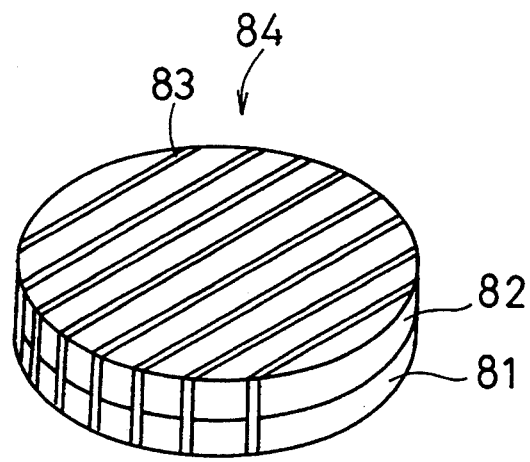
FIGS. 13(a) and 13(b) are perspective views illustrating an upper plate included in the apparatus of FIG. 12.
Figure 13:
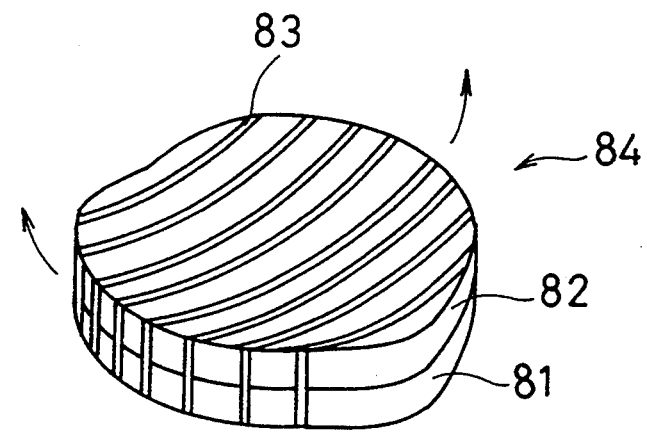

FIG. 12 is a sectional view illustrating an apparatus for separating a wafer from a support plate in accordance with an eighth embodiment of the present invention. FIGS. 13(a) and 13(b) are perspective views illustrating an upper plate employed in this apparatus. In this eighth embodiment, an upper plate 84 shown in FIG. 13(a) is employed in place of the upper plate 73 of the above-described seventh embodiment. The upper plate 84 is produced by cutting the upper plate 73 of the seventh embodiment into a plurality of small pieces in a direction perpendicular to the flat surface of the plate 73 at equal intervals and recombining these small pieces via insulating layers 83. The materials of the upper and lower layers 82 and 81 having different thermal expansion coefficients are the same as those employed in the seventh embodiment. A sheet heater, such as a rubber heater, is employed as the upper heater 85.

In this structure, since the curvature of the upper plate 84 due to the difference in thermal expansion coefficients between the upper and lower layers 82 and 81 is encouraged in the longitudinal direction of the small pieces of the upper plate, the surface of the lower layer 81 against which the glass plate 2 is held is convexly curved as shown in FIG. 13(b). Also in this embodiment, the same effects as described in the sixth embodiment are achieved.

Figure 14:
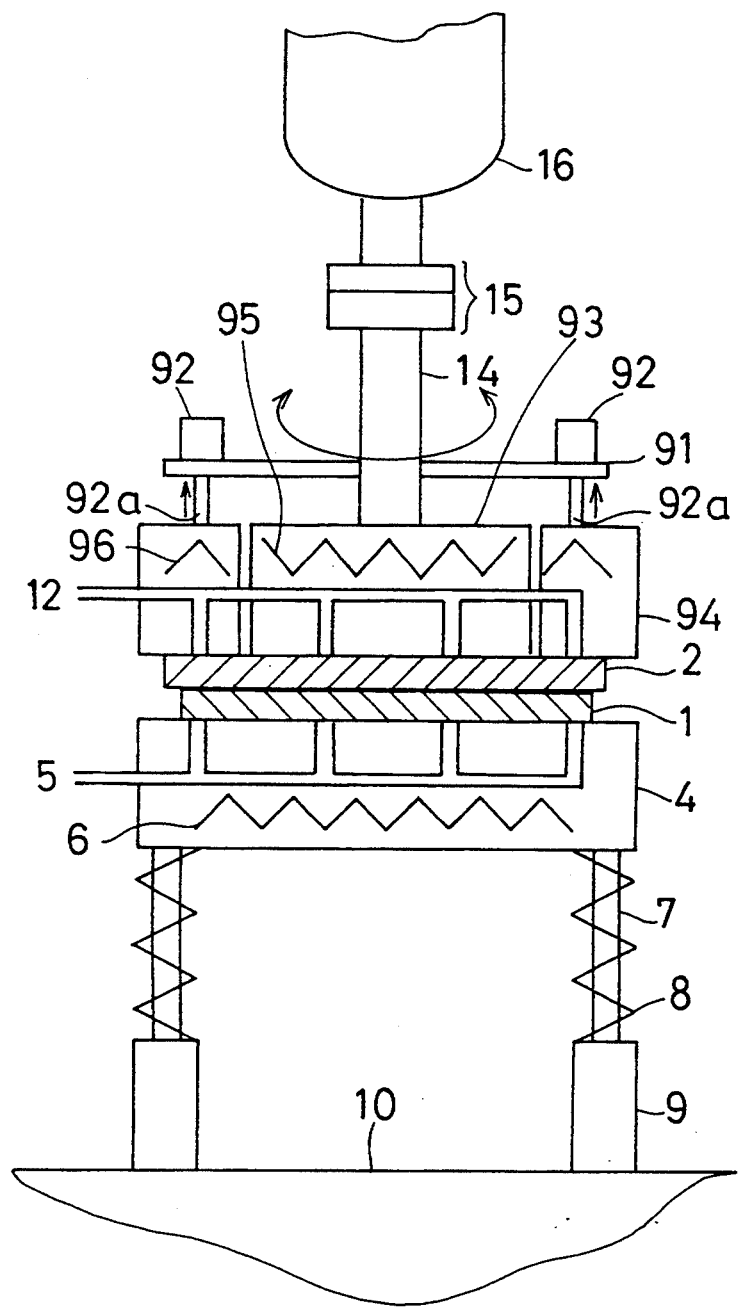
FIG. 14 is a sectional view illustrating an apparatus for separating a wafer from a support plate in accordance with a ninth embodiment of the present invention.
Figure 15:
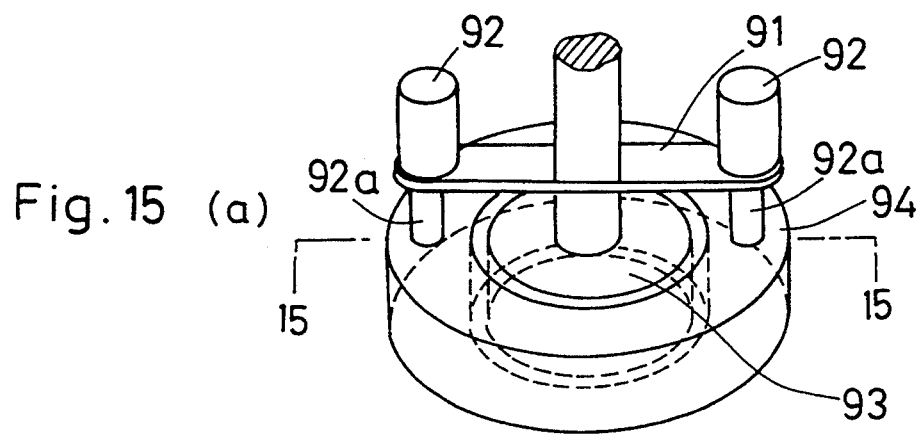
FIGS. 15(a) to 15(c) are diagrams for explaining the operation of an upper plate included in the apparatus shown in FIG. 14.
Figure 15:
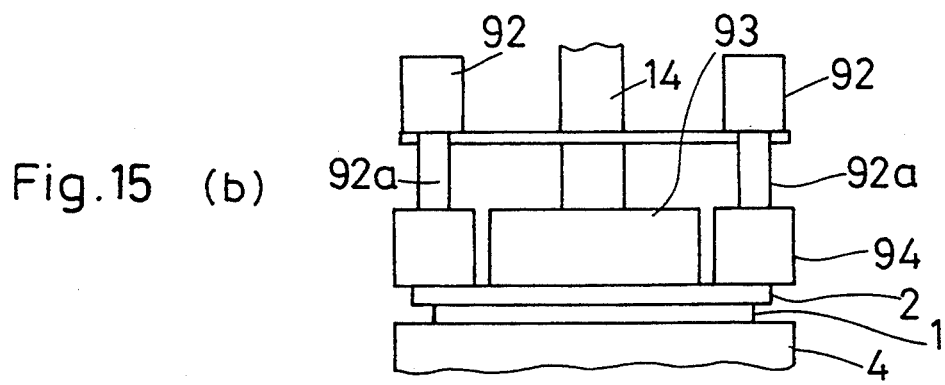
Figure 15:
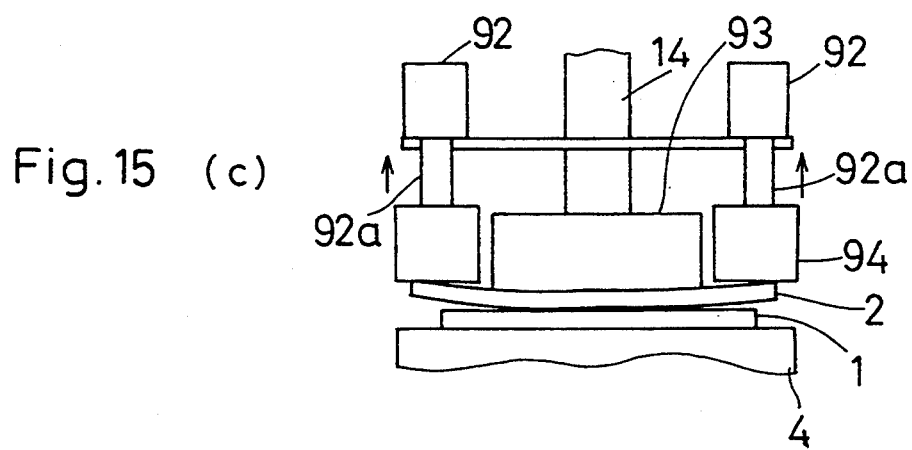

FIG. 14 is a sectional view illustrating an apparatus for separating a wafer from a support plate in accordance with a ninth embodiment of the present invention. FIG. 15(a) is a perspective view of an upper plate included in the apparatus of FIG. 14, and FIGS. 15(b) and 15(c) are sectional views taken along line 15—15 of FIG. 15(a) for explaining the operation of the upper plate. In this ninth embodiment, the upper plate comprises a central disc part 93 and a peripheral annular part 94. An end of the support shaft 14 is fixed to the center of the upper surface of the disc part 93 while the other end is connected to the robot arm 16 via the coupling 15. A pair of cylinders 92, each having a cylinder pin 92a, are disposed on the upper surface of the annular part 94 at opposite sides of the support shaft 14. These cylinders 92 are supported by a cylinder fixture 91 which is fixed to the support shaft 14. Reference numerals 95 and 96 designate sheet heaters.

A description is give of the operation.

As shown in FIG. 15(b), when the glass plate 2 of the work is held against the lower surface of the upper plate, the central disc part 93 and the peripheral annular part 94 of the upper plate are on the same level. Then, the wax 209 is softened by the sheet heaters 95 and 96 and the cartridge heater 6. Thereafter, only the peripheral annular part 94 is moved upward by the air cylinders 92, whereby the peripheral portion of the glass plate 2 is bent upward as shown in FIG. 15(c). Also in this embodiment, since the separation of the glass plate 2 starts from the periphery of the wafer 1, the same effects as described in the sixth embodiment are achieved.

While in the above-described ninth embodiment the upper plate comprises two parts, i.e., the central disc part 93 and the peripheral annular part 94, it may comprise three parts or more, i.e., a central disc part and a plurality of peripheral annular parts.

Figure 16:
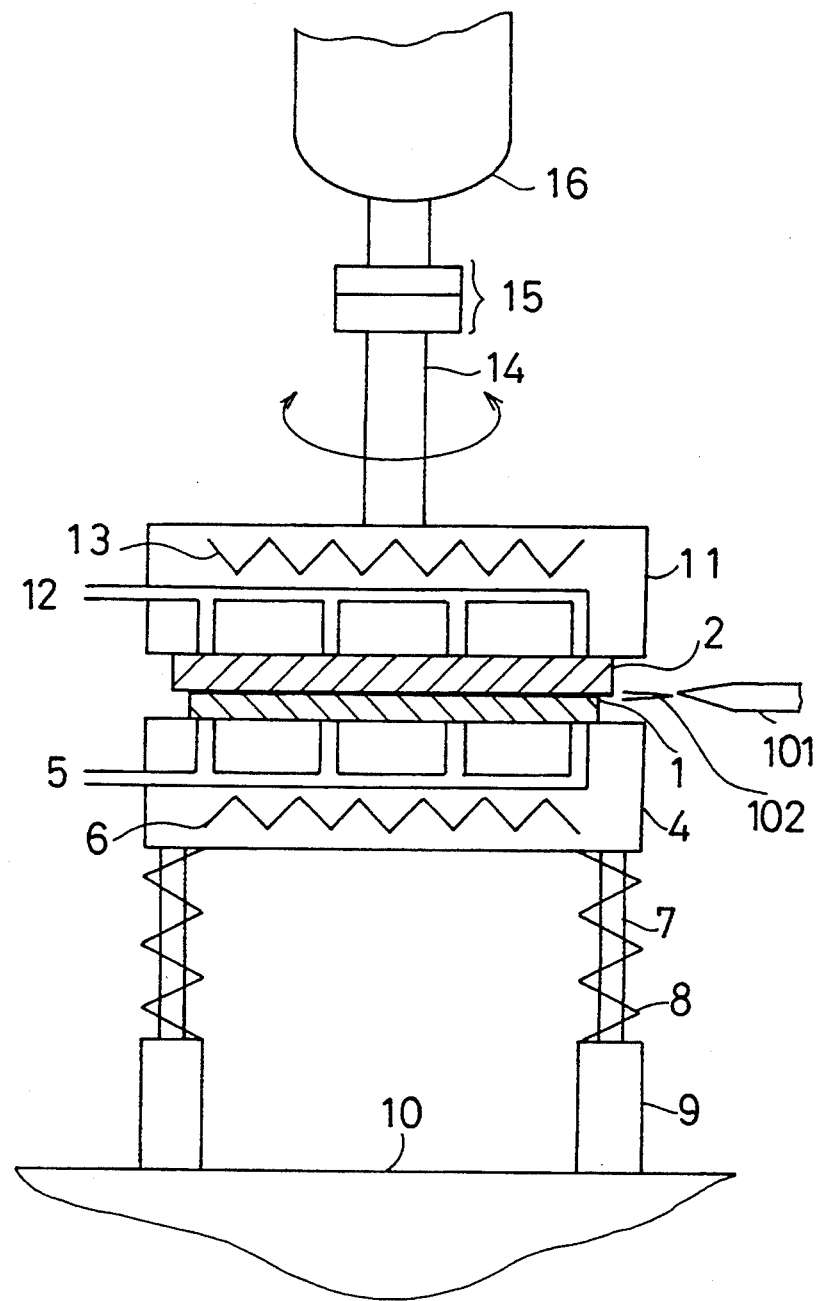
FIG. 16 is a sectional view illustrating an apparatus for separating a wafer from a support plate in accordance with a tenth embodiment of the present invention.

FIG. 16 is a sectional view illustrating an apparatus for separating a wafer from a glass plate in accordance with a tenth embodiment of the present invention. In this tenth embodiment, the apparatus according to the first embodiment includes a nozzle 101 for applying a solution 102 that dissolves an adhesive, such as wax, to the boundary between the wafer 1 and the glass plate 2. Preferably, SOLFIN-TM (trademark of TOKUYAMA PETROCHEMICAL CO., LTD.) is employed as the solution 102.

In this structure, since the wax connecting the wafer 1 and the glass plate 2 is gradually dissolved by applying the solution 102 to the boundary between them, the adhesion of the wax is reduced, whereby the subsequent separation process using the robot arm 16 is facilitated. In addition, it is possible to remove the wax before the separation process.

If the nozzle 101 is movable in the vertical direction, it is possible to apply the solution 102 during the separation process using the robot arm 16. That is, even when the lower plate 4 is moved upward by the robot arm 16 and the boundary between the wafer 1 and the glass plate 2 is moved upward, the solution 102 can be applied to the boundary, whereby the time required for the separation process is reduced.

The nozzle 101 may be included in the apparatus according to the above-described second to tenth embodiments of the present invention. In this case, the separation between the wafer and the glass plate is further facilitated.

Figure 17:
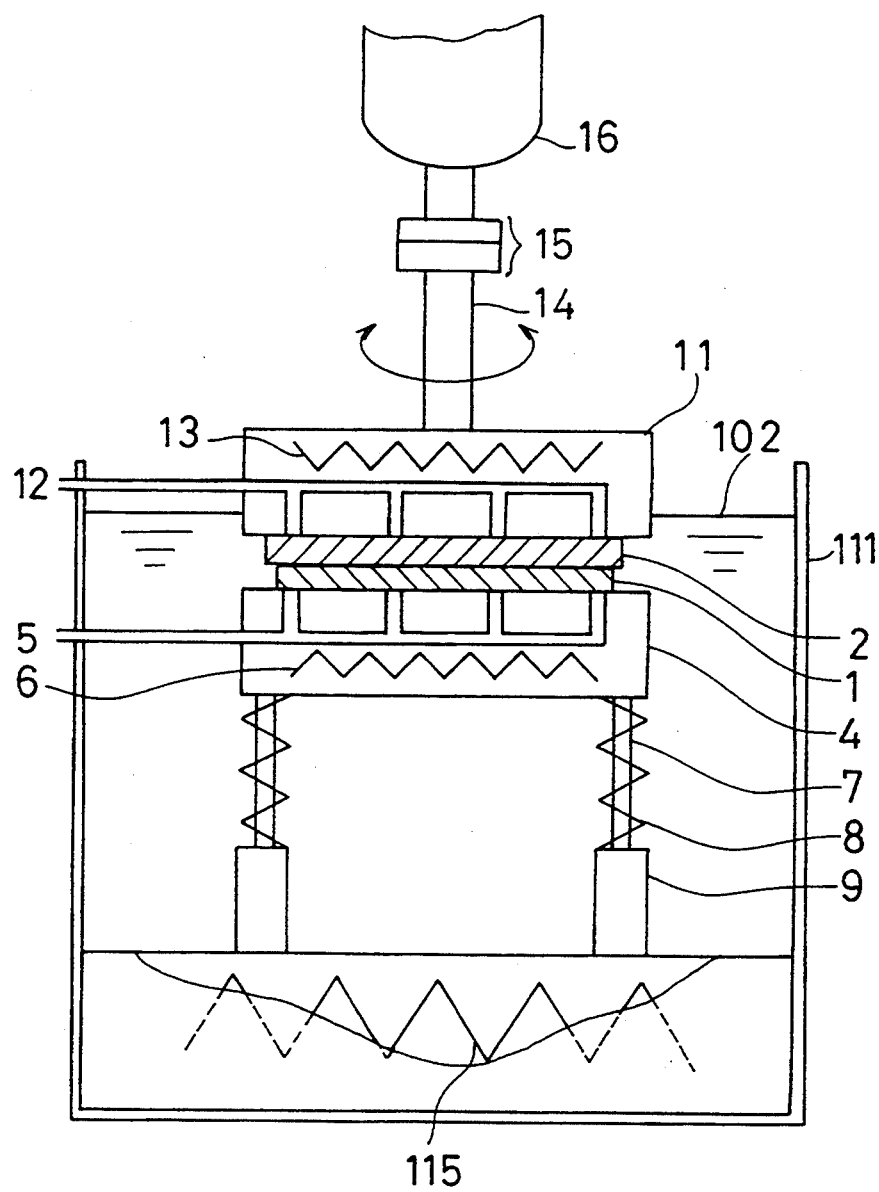
FIG. 17 is a sectional view illustrating an apparatus for separating a wafer from a support plate in accordance with an eleventh embodiment of the present invention.

FIG. 17 is a sectional view illustrating an apparatus for separating a wafer from a support plate in accordance with an eleventh embodiment of the present invention. In this eleventh embodiment, the apparatus according to the first embodiment shown in FIG. 1 is disposed in a container 111 filled with the solution 102. A heater 115 for heating the solution 102 is buried in a part of the container 111.

In this structure, the solution 102 heated by the buried heater 115 permeates into the wax 209 connecting the wafer 1 and the glass plate 2 and dissolves the wax 209, whereby the separation is carried out with high reliability.

Figure 18:
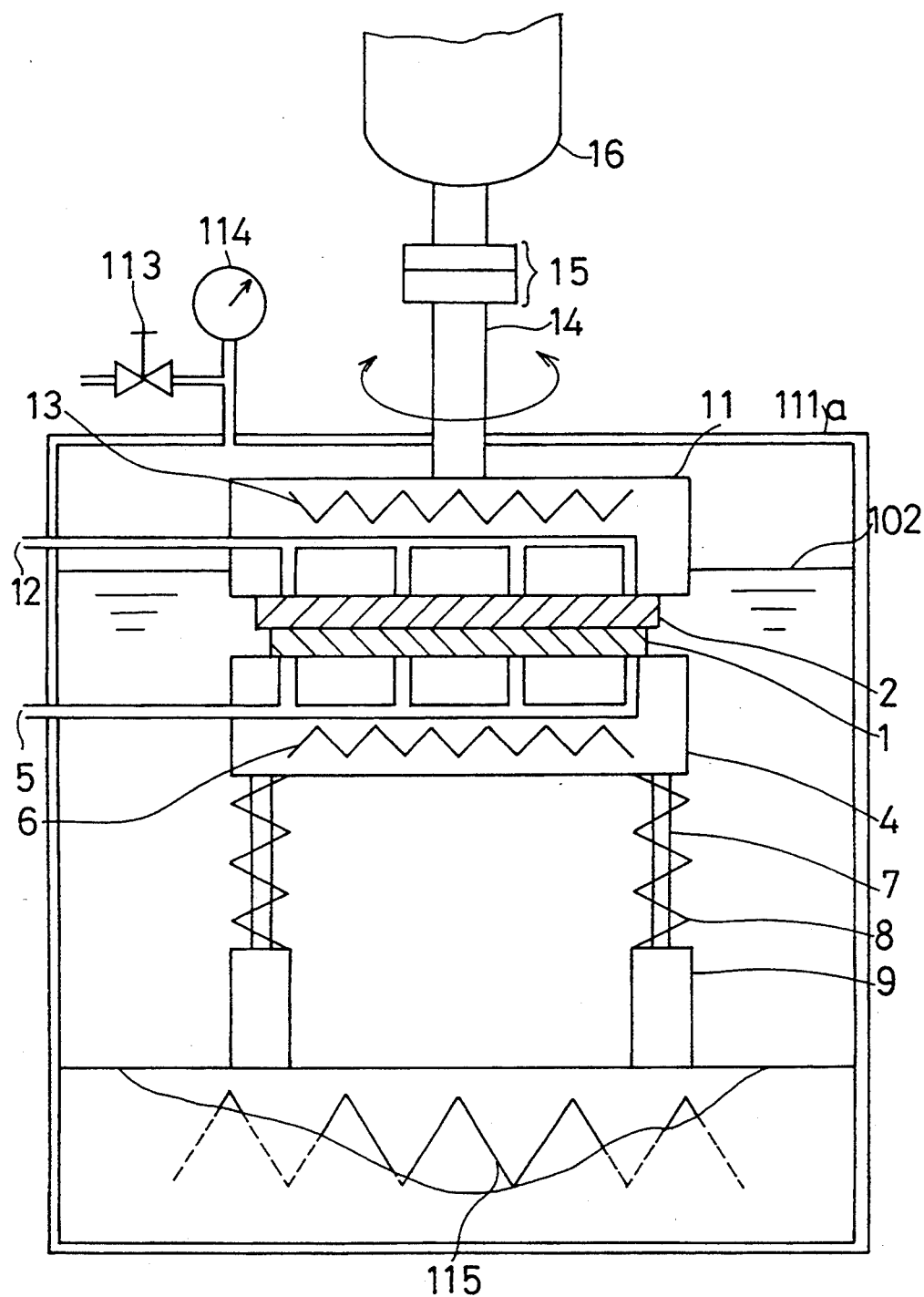
FIG. 18 is a sectional view illustrating an apparatus for separating a wafer from a support plate in accordance with a twelfth embodiment of the present invention.
Figure 19:
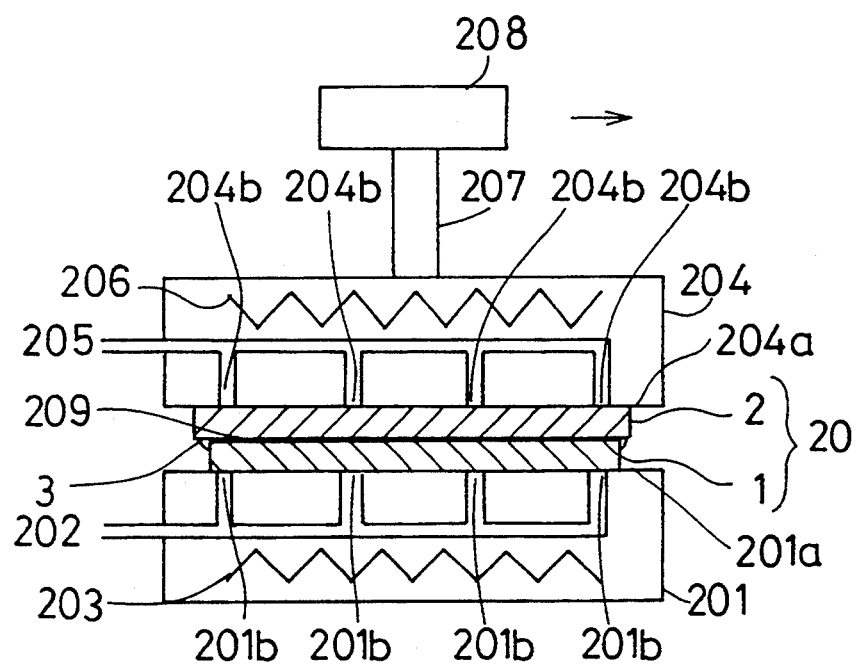
FIG. 19 is a sectional view illustrating an apparatus for separating a wafer from a support plate in accordance with the prior art.
Figure 20:
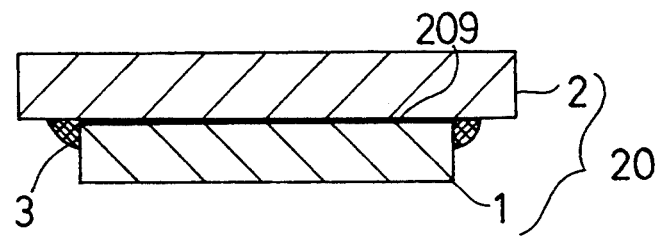
FIG. 20 is a sectional view illustrating a work in a state where prescribed process steps for the wafer and the support plate are completed.

FIG. 18 is a sectional view illustrating an apparatus for separating a wafer from a support plate in accordance with a twelfth embodiment of the present invention. In this twelfth embodiment, the apparatus according to the first embodiment shown in FIG. 1 is hermetically sealed in a container 111a, and an inert gas, such as $N_2$, is introduced into the container 111a to a prescribed pressure using a valve 113 and a pressure gauge 114.

In this structure, since the pressure in the container 111a is increased, the permeation of the solution 102 into the wax connecting the wafer and the glass plate is increased, whereby the separation process is smoothly carried out.

What is claimed is:

1. An apparatus for separating a wafer from a support plate attached to the wafer with a thermally softened adhesive, the wafer and support plate constituting a work having opposite first and second surfaces, the apparatus comprising:

an upper plate having opposite upper and lower surfaces and a plurality of holes at the lower surface through which air is evacuated to hold the first surface of the work to the lower surface;
a lower plate having opposite upper and lower surfaces and a plurality of holes at the upper surface through which air is evacuated to hold the second surface of the work to the upper surface;
a heater for softening the thermally softened adhesive embedded in at least one of the upper and lower plates;
a robot arm for moving the upper plate in vertical and horizontal directions; and
a shaft rotatably connecting the upper plate to the robot arm.

2. The apparatus of claim 1 comprising means for absorbing shock generated when the work held against the lower surface of the upper plate is put in contact against the upper surface of the lower plate, said shock absorbing means being disposed beneath the lower plate.

3. The apparatus of claim 2 wherein said shock absorbing means comprises:
a plurality of rods fixed to the lower surface of the lower plate at right angles;
a plurality of cylindrical holders disposed beneath the lower plate in which respective rods are movably inserted in a vertical direction; and
a plurality of springs disposed between the lower plate and the respective cylindrical holders.

4. The apparatus of claim 1 comprising means for holding the support plate to the lower surface of the upper plate by pressing the support plate against the lower surface of the upper plate, said means being disposed at a periphery of the upper plate.

5. The apparatus of claim 4 wherein said support plate holding means comprises:
at least two air cylinders fixed to the periphery of the upper plate; and
claws connected to the respective cylinders for holding the peripheral portion of the support plate on the lower surface of the upper plate.

6. The apparatus of claim 1 comprising means for pulling the lower plate downward in the vertical direction disposed on the lower surface of the lower plate.

7. The apparatus of claim 6 wherein said lower plate pulling means is a weight fixed to the lower surface of the lower plate.

8. The apparatus of claim 6 wherein said lower plate pulling means is an air cylinder connected to the lower surface of the lower plate.

9. The apparatus of claim 6 wherein said lower plate pulling means comprises:
a plurality of rods fixed to the lower surface of the lower plate at right angles;
a plurality of cylindrical holders disposed beneath the lower plate, in which the respective rods are inserted movably in vertical direction; and
a plurality of springs disposed between the lower plate and the respective cylindrical holders, each spring having opposite ends respectively fixed to the lower plate and the cylindrical holder.

10. The apparatus of claim 1 wherein said upper plate has a convex lower surface.

11. The apparatus of claim 1 wherein said upper plate comprises a first layer having a surface for contacting a work and a second layer disposed on the first layer, and the first layer has a thermal expansion coefficient larger than that of the second layer.

12. The apparatus of claim 11 wherein the upper plate comprising the first and second layers is divided into a plurality of parts having the same width in a direction perpendicular to the upper plate, and a heat insulating material is interposed between the adjacent parts.

13. The apparatus of claim 1 wherein said upper plate comprises a shape memory alloy which deforms when heated so that the upper plate has a convex lower surface.

14. The apparatus of claim 1 wherein said upper plate comprises a central disc part fixed to the shaft, and a peripheral annular part surrounding the disc part and moving in the vertical direction.

15. The apparatus of claim 1 comprising a nozzle for applying a solution that dissolves the thermally softened adhesive to the wafer and the support plate.

16. The apparatus of claim 1 comprising a container containing the apparatus and filled with a solution that dissolves the thermally softened adhesive.

17. The apparatus of claim 16 wherein said container is hermetically sealed for applying pressure to the solution in the container.

18. The apparatus of claim 16 comprising a heater for heating the solution.

19. The apparatus of claim 17 comprising a heater for heating the solution.

* * * * *